(12) United States Patent
Denhez

(10) Patent No.: US 9,740,720 B2
(45) Date of Patent: Aug. 22, 2017

(54) SECURE AND LOSSLESS DATA COMPRESSION

(71) Applicant: Alcatel Lucent, Boulogne Billancourt (FR)

(72) Inventor: Alain Denhez, Velizy (FR)

(73) Assignee: Alcatel Lucent, Boulogne-Billancourt (FR)

( * ) Notice: Subject to any disclaimer, the term of this patent is extended or adjusted under 35 U.S.C. 154(b) by 249 days.

(21) Appl. No.: 14/433,227

(22) PCT Filed: Sep. 20, 2013

(86) PCT No.: PCT/EP2013/069581
§ 371 (c)(1),
(2) Date: Apr. 2, 2015

(87) PCT Pub. No.: WO2014/056703
PCT Pub. Date: Apr. 17, 2014

(65) Prior Publication Data
US 2015/0242448 A1    Aug. 27, 2015

(30) Foreign Application Priority Data
Oct. 9, 2012  (EP) ..................................... 12306230

(51) Int. Cl.
| G06F 17/30 | (2006.01) |
|---|---|
| H03M 7/30 | (2006.01) |
| H03M 7/40 | (2006.01) |

(52) U.S. Cl.
CPC ........ *G06F 17/30324* (2013.01); *H03M 7/30* (2013.01); *H03M 7/40* (2013.01)

(58) Field of Classification Search
CPC ................................................ G06F 17/30153
See application file for complete search history.

(56) References Cited

U.S. PATENT DOCUMENTS

| 4,929,946 A | 5/1990 | O'Brien et al. |
|---|---|---|
| 7,769,729 B2 * | 8/2010 | Faerber ............... H03M 7/3084 707/693 |

(Continued)

FOREIGN PATENT DOCUMENTS

| CN | 101090273 | 12/2007 |
|---|---|---|
| CN | 101095284 | 12/2007 |

OTHER PUBLICATIONS

Misha Wolf et al., "Unicode Technical Report #6 A Standard Compression Scheme for Unicode," Internet Citation, pp. 1-13, XP002129267, Sep. 30, 1998 (retrieved on Jan. 31, 2000).

(Continued)

*Primary Examiner* — Mohammad S Rostami
(74) *Attorney, Agent, or Firm* — Fay Sharpe, LLP

(57) ABSTRACT

A method for compressing a string of characters, initially defined by an original ordered sequence of characters each represented by an absolute number uniquely representing each character, according to an absolute coding table, comprising the steps of: -parsing said original sequence into at least one first type sub¬ sequence comprising contiguous characters, each of the contiguous characters of the first type sub-sequence being selected based on a matching character in a relative coding table (20), and, into at least one second type sub-sequence comprising remaining contiguous characters, -coding each first type sub-sequence using said relative coding table (20), -representing each character from each second type sub-sequence by its absolute representing number from said absolute coding table. A corresponding method for decompressing a compressed sequence.

14 Claims, 5 Drawing Sheets

(56) References Cited

U.S. PATENT DOCUMENTS

| | | | | |
|---|---|---|---|---|
| 8,306,956 B2* | 11/2012 | Livshits | .................. | H03M 7/30 341/55 |
| 8,356,019 B1* | 1/2013 | Pedersen | ........... | G06F 17/30595 707/693 |
| 9,195,695 B2* | 11/2015 | Yates | ................. | G06F 17/30321 |
| 9,390,099 B1* | 7/2016 | Wang | ................ | G06F 17/30153 |
| 2013/0204850 A1* | 8/2013 | Bienert | ............. | G06F 17/30153 707/693 |
| 2013/0262412 A1* | 10/2013 | Hawton | ............ | G06F 17/30153 707/693 |
| 2014/0108364 A1* | 4/2014 | Dani | ....................... | H03M 7/40 707/693 |

OTHER PUBLICATIONS

David Salomon, "Data compression: The complete reference, $3^{rd}$ Edition," Springer Verlag, pp. 18-19, XP002695265, 2004.
International Search Report for PCT/EP2013/069581 dated Oct. 24, 2013.

* cited by examiner

| | | 4 | 5 | | | 13 | 14 | | | 16 | | | | | |
|---|---|---|---|---|---|---|---|---|---|---|---|---|---|---|---|
| 1 | Text | " | 8 | 8 | 8 | " | | O | r | a | n | g | e | | v | o |
| 2 | ASCII | 22 | 38 | 38 | 38 | 22 | 20 | 4F | 72 | 61 | 6E | 67 | 65 | 20 | 76 | 6F |
| 3 | SLCD | 22 | 38 | 38 | 38 | 22 | 12 | 20 | 41 | C5 | 47 | 94 | F7 | C5 | E7 | E7 |
| | Text | i | c | e | m | a | i | l | : | | o | n | | 1 | 2 | / |
| | ASCII | 69 | 63 | 65 | 6D | 61 | 69 | 6C | 3A | 20 | 6F | 6E | 20 | 31 | 32 | 2F |
| | SLCD | 49 | 2F | A1 | E1 | 69 | 70 | B4 | C2 | 2C | C0 | 31 | 32 | 2F | 30 | 35 |
| | Text | 0 | 5 | / | 1 | 1 | | a | t | | 1 | 7 | h | 4 | 4 | |
| | ASCII | 30 | 35 | 2F | 31 | 31 | 20 | 61 | 74 | 20 | 31 | 37 | 68 | 34 | 34 | 20 |
| | SLCD | 2F | 31 | 31 | 20 | 61 | 74 | 20 | 31 | 37 | 68 | 34 | 34 | 12 | 20 | 7C |
| | Text | t | h | i | s | | c | o | r | r | e | s | p | o | n | d |
| | ASCII | 74 | 68 | 69 | 73 | 20 | 63 | 6F | 72 | 72 | 65 | 73 | 70 | 6F | 6E | 64 |
| | SLCD | 5A | 7E | 79 | 6B | 7D | 5F | 10 | 41 | 99 | 2E | 26 | 95 | F5 | 11 | C4 |
| | Text | e | n | t | | h | a | s | | c | a | l | l | e | d | |
| | ASCII | 65 | 6E | 74 | 20 | 68 | 61 | 73 | 20 | 63 | 61 | 6C | 6C | 65 | 64 | 20 |
| | SLCD | E6 | E9 | 6B | 7D | 3F | 79 | 8F | 39 | 4B | 4C | 23 | 7C | 7C | 46 | AE |
| | Text | o | n | e | | t | i | m | e | | w | i | t | h | o | u |
| | ASCII | 6F | 6E | 65 | 20 | 74 | 69 | 6D | 65 | 20 | 77 | 69 | 74 | 68 | 6F | 75 |
| | SLCD | 7C | 6E | 5E | 45 | AE | 79 | 4F | 1C | 1D | F1 | 3A | 6E | 37 | 93 | B2 |
| | Text | t | | l | e | a | v | i | n | g | | a | | m | e | s |
| | ASCII | 74 | 20 | 6C | 65 | 61 | 76 | 69 | 6E | 67 | 20 | 61 | 20 | 6D | 65 | 73 |
| | SLCD | C6 | C1 | EE | 19 | 8F | 39 | 4F | 6B | 1D | 24 | EB | | | | |
| | Text | s | a | g | e | . | C1 | C2 | | | | | | | | |
| | ASCII | 73 | 61 | 67 | 65 | 2E | 24 | EB | | | | | | | | |
| | SLCD | | | | | | 18 | | | 19 | | | | | | |

FIG.2

SECURE AND LOSSLESS DATA COMPRESSION

TECHNICAL FIELD

The technical field is the one of communication of information. More particularly it is addressed towards a secure and lossless compressing/decompressing.

BACKGROUND

A text is a string of characters, ordered as a sequence of characters. A typical way to numerically represent a character is by using an absolute coding table, where each character is represented by a unique absolute number. One of the most famous such absolute coding table is one defined by the ASCII norm. In such an ASCII absolute coding table each character is typically represented by a unique one byte number, thus limiting the size of such an ASCII absolute coding table to 256 characters. A typical way to numerically represent an ordered sequence of characters is to provide a corresponding ordered sequence of numbers, each character being represented by its absolute number, in the same order. Consequently a string of n characters is represented by a sequence of numbers occupying n bytes. In view of the increase in data or text traffic, e.g. on mobile phone networks, such an occupation appears to be too high.

There exist some compressing solutions, such as zip, rar, etc., however these solutions may not bring any size decrease, especially when applied to short length strings of text characters.

A compressing/decompressing scheme exhibiting a noticeable size decrease, even for short length strings, is desirable.

SUMMARY

An embodiment concerns a method for compressing a string of characters, initially defined by an original ordered sequence of characters each represented by an absolute number uniquely representing each character, according to an absolute coding table, comprising the steps of: parsing said original sequence into at least one first type sub-sequence comprising contiguous characters, each of the contiguous characters of the first type sub-sequence matching a corresponding character in a relative coding table, and into at least one second type sub-sequence comprising contiguous remaining characters, coding each first type sub-sequence using said relative coding table, copying each character from each second type sub-sequence into said compressed sequence, each character being represented by its absolute representing number from said absolute coding table.

According to a feature of an embodiment, the coding of a first type sub-sequence may further comprise the steps of: coding the initial character of said sub-sequence by its original absolute representing number from said absolute coding table, as a keycode, coding each character following said initial character in said sub-sequence by coding a displacement in said relative coding table, between a character preceding said character and said character, ending the coding of said first type sub-sequence by coding a displacement toward a second specific control character in said relative coding table, indicative of an end of coding, after the last character in said sub-sequence.

According to another feature of an embodiment, said method may further comprise the step of: inserting a checksum, computed from said original sequence, into said compressed sequence.

According to another feature of an embodiment, the coding of a displacement in said relative coding table, between a preceding character and a following character, may comprise the steps of: determining a first coordinate separating, in said relative coding table, said preceding character from said following character, along a first predetermined direction, determining a second coordinate separating, in said relative coding table, said preceding character from said following character, along a second predetermined direction, concatenating all determined coordinates, in order, into the compressed sequence.

According to another feature of an embodiment, said first coordinates are chosen in a first set of numbers and said second coordinates are chosen in a second set of numbers, no number being shared between said first set of numbers and said second set of numbers, and one first particular coordinate among said first set, and one second particular coordinate among said second set, are omitted in the compressed sequence, except when two particular coordinates are immediately following, in which case said following particular coordinate is not omitted.

According to another feature of an embodiment, said relative coding table is populated with the most frequent characters, as expected in strings of characters to be compressed.

According to another feature of an embodiment, said relative coding table is an 8 by 8 matrix, said first coordinate being chosen in a first range of [0 . . . 7] according to a circular count of columns from left to right, said second coordinate being chosen in a second range of [8 . . . F] according to a circular count of rows, with 8 added, from top to bottom, the first particular coordinate being the first coordinate corresponding to zero separating columns, and the second particular coordinate being the second coordinate corresponding to zero separating rows.

According to another feature of an embodiment, said method further comprises, between the parsing step and the coding step, the step of: checking for each first type sub-sequence if the coded sub-sequence that would be obtained through a coding step is shorter than the original sub-sequence, if not, treating said first type sub-sequence as a second type sub-sequence.

Another embodiment concerns a method for decompressing a compressed sequence, into a string of characters, defined by a final ordered sequence of characters each represented by an absolute number uniquely representing each character, according to an absolute coding table, comprising one or more steps of: extracting from said compressed sequence at least one coded sub-sequence of contiguous numbers, decoding said coded sub-sequence into a final decoded sub-sequence, using a relative coding table, keeping remaining numbers and copying each said remaining number into the decompressed sequence 2 as a character represented by an absolute number using said absolute coding table.

According to another feature of an embodiment, extracting and decoding steps may further comprise steps of: copying an initial number as a character represented by said absolute number according to said absolute coding table, in said final decoded sub-sequence, preprocessing following numbers, following said initial number, in said coded sub-sequence, decoding following numbers, as relative displacements, in said relative coding table, until a displacement points toward a second specific control character in said relative coding table, indicative of an end of coding, and thus indicative of an end of said coded sub-sequence.

According to another feature of an embodiment, decoding following numbers step may further comprise steps of: starting with a current character being said initial character, a current position being the position of said initial character in said relative coding table, and a current pair of coordinates being the first pair of first coordinate and second coordinate in said coded sub-sequence, repeating the following steps, until the new position points toward a second specific control character in said relative coding table: applying from the current position in said relative coding table, a displacement as coded by the current pair of first coordinate and second coordinate, the first coordinate indicating a circular count of columns along a first predetermined direction, the second coordinate indicating a circular count of rows along a second predetermined direction, to find a new position, indicating a new decoded character, copying said new decoded character after said current character in said decoded final sub-sequence, updating the current character to said new decoded character, updating the current position to said new position, updating the current pair of coordinate to the next pair of first coordinate and second coordinate in said coded sub-sequence.

According to another feature of an embodiment, said first coordinates are chosen in a first set of numbers and said second coordinates are chosen in a second set of numbers, no number being shared between said first set of numbers and said second sets of numbers, the preprocessing following numbers step further comprising the steps of: inserting a first particular coordinate before any second particular coordinate, inserting a second particular coordinate before any first particular coordinate, inserting a first particular coordinate between any two contiguous second coordinates, inserting a second particular coordinate between any two contiguous first coordinates.

According to another feature of an embodiment, said relative coding table is an 8 by 8 matrix, said first coordinate being chosen in a first range of [0 . . . 7] according to the circular count of columns from left to right, said second coordinate being chosen in a second range of [8 . . . F] according to the circular count of rows, with 8 added, from top to bottom, the first particular coordinate being the first coordinate corresponding to zero separating columns, and the second particular coordinate being the second coordinate corresponding to zero separating rows.

Another embodiment concerns a compressor comprising means for compressing a string of characters into a compressed sequence according to such a compressing method.

One embodiment concerns a compressor for compressing a string of characters initially defined by an original ordered sequence of characters each represented by an absolute number uniquely representing each character, according to an absolute coding table, into a compressed sequence, comprising a parser for parsing said original sequence into at least one first type sub-sequence comprising contiguous characters each of the contiguous characters of the first type sub-sequence being selected based on a corresponding character in a relative coding table, and into at least one second type sub-sequence comprising contiguous remaining characters, a coder for coding each first type sub-sequence using said relative coding table, a copier for copying each character from each second type sub-sequence in said compressed sequence, each character being represented by its absolute representing number from said absolute coding table.

According to another feature of an embodiment the coder further comprises: a first sub-coder for coding the initial character of said sub-sequence by its original absolute representing number from said absolute coding table, as a keycode, a second sub-coder for coding each character following said initial character in said sub-sequence by coding a displacement in said relative coding table, between a character preceding said character and said character, a third sub-coder for ending the coding of said first type sub-sequence by coding a displacement toward a second specific control character in said relative coding table, indicative of an end of coding, after the last character in said sub-sequence.

According to another feature of an embodiment, the compressor further comprises: an inserter for inserting a checksum, computed from said original sequence, into said compressed sequence.

According to another feature of an embodiment the second sub-coder further comprises: a first determiner for determining a first coordinate, separating, in said relative coding table, said preceding character from said following character, along a first predetermined direction, a second determiner for determining a second coordinate, separating, in said relative coding table, said preceding character from said following character, along a second predetermined direction, and a concatener for concatenating all determined coordinates, in order, into the compressed sequence.

According to another feature of an embodiment said first coordinates are chosen in a first set of numbers and said second coordinates are chosen in a second set of numbers, no number is shared between said first set of numbers and said second set of numbers, and one first particular coordinate among said first set, and one second particular coordinate among said second set, are omitted in the compressed sequence, except when two particular coordinates are immediately following, in which case said following particular coordinate is not omitted.

According to another feature of an embodiment said relative coding table is populated with the most frequent characters, as expected in strings of characters to be compressed.

According to another feature of an embodiment said relative coding table is an 8 by 8 matrix, said first coordinate being chosen in a first range of [0 . . . 7] according to a circular count of columns from left to right, said second coordinate being chosen in a second range of [8 . . . F] according to a circular count of rows, with 8 added, from top to bottom, the first particular coordinate being the first coordinate corresponding to zero separating columns, and the second particular coordinate being the second coordinate corresponding to zero separating rows.

According to another feature of an embodiment said compressor further comprises a checker for checking for each first type sub-sequence if the coded sub-sequence that would be obtained is shorter than the original sub-sequence, and if not, for treating said first type sub-sequence as a second type sub-sequence.

Another embodiment concerns a decompressor comprising means for decompressing a compressed sequence into a string of characters according to such a decompressing method.

One embodiment concerns a decompressor for decompressing a compressed sequence into a string of characters defined by a final ordered sequence of characters each represented by an absolute number uniquely representing each character, according to an absolute coding table, comprising: an extractor for extracting from said compressed sequence at least one coded sub-sequence of contiguous numbers, a decoder for decoding said coded sub-sequence into a final decoded sub-sequence, using a relative coding table, a keeper for keeping remaining numbers and a copier for copying each said remaining number into the decompressed sequence as a character represented by an absolute number using said absolute coding table.

According to another feature of an embodiment the extractor and decoder further comprise: a sub-copier for copying an initial number as a character represented by said absolute number according to said absolute coding table, in said final decoded sub-sequence, a preprocessor for preprocessing following numbers, following said initial number, in said coded sub-sequence, a sub-decoder for decoding following numbers, as relative displacements, in said relative coding table, until a displacement points toward a second specific control character in said relative coding table, indicative of an end of coding, and thus indicative of an end of said coded sub-sequence.

According to another feature of an embodiment the sub-decoder further comprises: a starter for starting with a current character being said initial character, a current position being the position of said initial character in said relative coding table, and a current pair of coordinates being the first pair of first coordinate and second coordinate in said coded sub-sequence, a repeater for repeating, until the new position points toward a second specific control character in said relative coding table: applying from the current position in said relative coding table, a displacement as coded by the current pair of first coordinate and second coordinate, the first coordinate indicating a circular count of columns along a first predetermined direction, the second coordinate indicating a circular count of rows along a second predetermined direction, to find a new position, indicating a new decoded character, copying said new decoded character after said current character in said decoded final sub-sequence, updating the current character to said new decoded character, updating the current position to said new position, updating the current pair of coordinate to the next pair of first coordinate and second coordinate in said coded sub-sequence.

According to another feature of an embodiment said first coordinates are chosen in a first set of numbers and said second coordinates are chosen in a second set of numbers, no number is shared between said first set of numbers and said second sets of numbers, and the preprocessor further comprises: a separator for separating said following numbers into coordinates, a first insertor for inserting a first particular coordinate before any second particular coordinate, a second insertor for inserting a second particular coordinate before any first particular coordinate, a third insertor for inserting a first particular coordinate between any two contiguous second coordinates, a fourth insertor for inserting a second particular coordinate between any two contiguous first coordinates.

According to another feature of an embodiment said relative coding table is an 8 by 8 matrix, said first coordinate being chosen in a first range of [0 . . . 7] according to the circular count of columns from left to right, said second coordinate being chosen in a second range of [8 . . . F] according to the circular count of rows, with 8 added, from top to bottom, the first particular coordinate being the first coordinate corresponding to zero separating columns, and the second particular coordinate being the second coordinate corresponding to zero separating rows.

BRIEF DESCRIPTION OF THE DRAWINGS

Others features, details and advantages of the invention will become more apparent from the detailed illustrating description given hereafter with respect to the drawings on which:

FIG. 2 show an example of a string, absolutely coded, and coded according to one embodiment.

DETAILED DESCRIPTION

Figure 1:
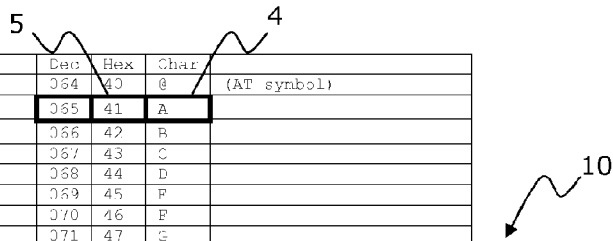
FIG. 1 illustrates an absolute coding table according to the ASCII norm.

A text is a string of characters, ordered as a sequence 1 of characters 4. A typical way to numerically represent a character 4 is by using an absolute coding table 10, where each character 4 is represented by a unique absolute number 5. One of the most famous such absolute coding table 10 is one defined by the ASCII norm. A first half of an ASCII absolute coding table 10 is showed in FIG. 1. A character 4, mentioned in the $3^{rd}$ column, respectively in the $7^{th}$ column, is represented by an absolute number indicated in the $1^{st}$ column, respectively in the $5^{th}$ column, in decimal and by the same absolute number 5 indicated in the $2^{nd}$ column, respectively in the $6^{th}$ column, in hexadecimal. As an example, the character "A" is represented by the absolute number "065" in decimal and by the absolute number "41" in hexadecimal.

In such an ASCII absolute coding table 10 each character 4 is typically represented by a unique one byte number 5, thus limiting the size of such an ASCII absolute coding table to 256 characters (half of the table is figured). A typical way to numerically represent a text, being an ordered sequence 1 of characters 4, is to provide a corresponding ordered sequence 2 of numbers 5, wherein each character 4 is represented by its absolute number 5, in the same order. With reference to FIG. 2, an illustrative string 1: ""888" Orange voicemail: on Dec. 5, 2011 at 17h44 this correspondent has called one time without leaving a message.", has been represent ed using said ASCII absolute coding table 10. The first line of all blocks contains the string 1 of characters, the second line of each block contains, correspondingly the ordered sequence 2 of numbers 10, or ASCII codes, in hexadecimal.

Since such an absolute coding may not be efficient, a compressing method is proposed. The second line of all blocks is then representative of an original ordered sequence 2 to be compressed, and the third line of all blocks is the corresponding compressed sequence 3, as obtained from said original ordered sequence 2 through one embodiment of the compressing method.

Said compressing method uses, in addition of said absolute coding table 10, a relative coding table 20. An example of such a relative coding table 20 is presented in FIG. 4. Said compressing method may comprise several steps.

Figures 3, 4:
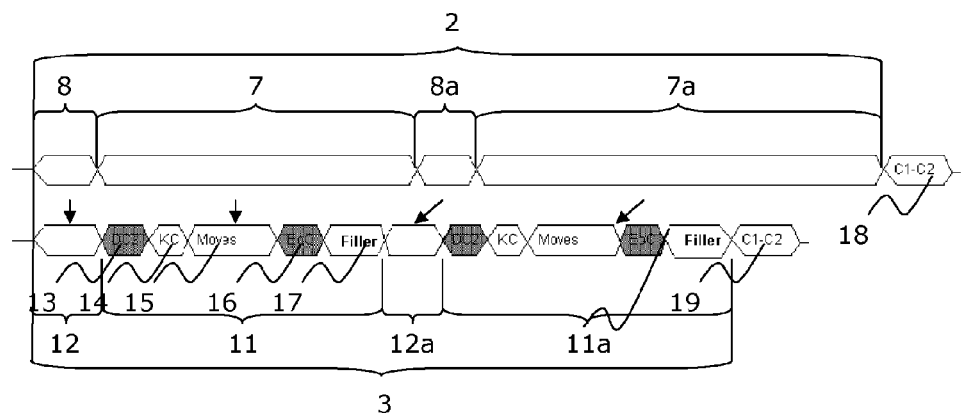
FIG. 3 illustrates the step of parting an original sequence into first and second type sub-sequence.
FIG. 4 illustrates a relative coding table.

With reference to FIG. 3, an original sequence 2 is figured on top as it enters the compressing method. On bottom of the FIG. 3, a compressed sequence 3 is figured as outputted by said compressing method.

According to a first step of the compressing method, said original sequence 2 is parsed into sub-sequences 7, 8. Said parsing is based on the content of said relative coding table 20. Said content is a set of characters, being at least a subset of the whole character set, as e.g. defined by the 256 characters contained in an absolute coding table 10. Accordingly one can define a first type character characterized in that it is comprised in said relative coding table 20, and thus also comprised in said absolute coding table 10. One can similarly define a second type character as being comprised in said absolute coding table 10 and not in said relative coding table 20. E.g. with the illustrative absolute coding table 10 of FIG. 1 and the illustrative relative coding table 20 of FIG. 4, characters "A"-"Z" present in said relative coding table 20 are first type characters, while characters "0"-"9" absent from said relative coding table 20 are second type characters.

Accordingly one can define a first type sub-sequence 7 as comprising contiguous characters of the first type, and a second type sub-sequence 8 comprising contiguous characters of any type. Thus, a first type character can be found in either a first type or a second type sub-sequence, while a second type character appears in a second type sub-sequence.

With reference to FIG. 3, the illustrative string: ""888" Orange voicemail: on Dec. 5, 2011 at 17h44 this correspondent has called one time without leaving a message.", can be parted, based on the relative coding table 20 of FIG. 4, into:
   a first second type sub-sequence 8: ""888"",
   a first first type sub-sequence 7: "Orange voicemail: on",
   a second second type sub-sequence 8a: "Dec. 5, 2011 at 17h44", and
   a second first type sub-sequence 7a: "this correspondent has called one time without leaving a message."

Since "at" comprises characters: space, "a" and "t", all present in said relative coding table 20, the sub-sequence 8a could have been further parted into three sub-sequences: "Dec. 5, 2011" of second type, "at" of first type and "17h44" of second-type. However, as will explain itself later the extracting of a first type sub-sequence 7 may be optional. Here, the first type sub-sequence "at" is considered to be too short to be interesting to extract and to code, as will be detailed later on.

More generally, the extracting of a first type sub-sequence 7 may be optional because there may not be any extractable first type sub-sequence, in a case where all characters pertain to the absolute coding table 10. In such a case, one second type sub-sequence equal to the original sequence 2 may be obtained through said parsing step.

Since, as will become apparent from the following, a compression gain may be obtained through coding of first type sub-sequences 7, it is interesting to extract the longest possible first type sub-sequences 7 and to use second type sub-sequence 8 to accommodate characters of the second type, absent from said relative coding table 20.

Depending on their type, these two types of so obtained sub-sequences are processed. Each first type sub-sequence 7 can be coded using said relative coding table 20, as will be detailed later on. Second type sub-sequences 8 are kept as they are. Otherwise said, a second type sub-sequence 8 remains represented using said absolute coding table 10, with each character 4 being represented by its absolute representing number 5 from said absolute coding table 10.

So a second type sub-sequence is simply copied from the original sequence 2 to the compressed sequence 3, in order.

A first type sub-sequence 7 is coded into a first type final coded sub-sequence 11. A second type sub-sequence 8 is copied into a second type final sub-sequence 12 identical to said original second type sub-sequence 8. The result of the compression method is a final compressed sequence 3 equal to the concatenation, in order, of said first and second type final sub-sequences 11, 12, as illustrated in FIG. 3.

The main benefit of the compressing method comes from the coding step applied to any first type sub-sequence 7. Such a coding step is based on said relative coding table 20 and comprises the several following steps. It is illustrated in FIG. 3.

To begin coding a first type sub-sequence 7, a first specific control character 13 is added to the beginning of the resulting corresponding final sub-sequence 11. Such a first specific control character 13 is placed here to indicate beginning of coding, to the attention of the decompressing method/ decoding step.

Said first specific control character 13 may be chosen arbitrarily. However some of the characters, as defined in absolute coding table 10, are dedicated to control purposes. Characters 4 whose codes are from "00" to "1F" are control characters. Many of them already have special purpose and would not be preferred candidates. Character DC2 (coded "12") is one possible candidate, since it is not frequently used nowadays. Examples in the present description uses said DC2 character as first specific control character 13 meaning beginning of coding.

Then the first character 14 of the sub-sequence 7 to be coded, is coded absolutely. This means said initial character 14 is represented by its original absolute representing number 5 from said absolute coding table 10. Said initial character 14 is also referred herein as a keycode 14. This means the first number of the sub-sequence 7 to be coded is copied to the final coded sub-sequence 11, after said first specific control character 13, in second position.

Then each character 4 following said first character 14 in said sub-sequence 7 is coded relatively by coding a displacement in said relative coding table 20, between a character preceding said character to be coded and said character. This means the final coded sub-sequence 11 contains, first the first specific control character 13, then the first character/ keycode 14, then a movement number 15 indicative of a displacement in said relative coding table 20 between said first character 14 and a second character immediately following said first character 14, then a movement number 15 indicative of a displacement between said second character and a third character immediately following said second character, and so on until the last character in said original sub-sequence 7. Since this is an important step, the relative coding of a displacement will be detailed later on.

The coding ends after said last character. The end of coding of said first type sub-sequence 7 is indicated in the final coded sub-sequence 11 by an additional movement number 15 coding a displacement toward a second specific control character 16, in said relative coding table 20, indicative of an end of coding, after the last character.

Now let us revert back to the illustrative string and to FIG. 2. The beginning of the string, comprising ""888"" comprises 5 characters absent from said relative coding table 20. Consequently they form a second type sub-sequence: the sub-sequence 8, which is coded {22, 38, 38, 38, 22} both in the original sequence 2 and in the compressed sequence 3. Then starts a first type sub-sequence 7: "Orange voicemail: on". Said original sub-sequence is initially coded {20, 4F, 72, 61, 6E, 67, 65, 20, 76, 6F, 69, 63, 65, 6D, 61, 69, 6C, 3A, 20, 6F, 6E, 20}. It then becomes, through the coding step, a final sub-sequence 11, comprising, in order, a first specific control character 13: DC2, whose code is "12", figured in light grey, followed by the representing number 5 of the first character 14 of original sub-sequence 7, being a "Space", whose code is "20". They are followed by movement numbers 15, coding in order each displacement between a character and the next character. Since the original sub-sequence 7 comprises 22 characters, they are 21 displacements to code. They are coded by the sequence of movement numbers 15: {41, C5, 47, 94, F7, C5, E7, E7, 49, 2F, A1, E1, 69, 70, B4, C2, 2C} here comprising 17 bytes, due to an advantageous decrease provided by the method. The final sub-sequence 11 ends by a last movement number 15, here "0C", corresponding to a displacement between the last character, here " " (Space) and a second specific control character 16 in said relative coding table 20. As will be detailed later, said movement number "0C" became "C" by omitting the preceding "0". Then a "0" filler has been added after it, to exhibit an even number of half bytes. This leads to the "C0" number, figured in heavy grey, in FIG. 2. The next numbers {31, 32, 2F, . . . } are the absolute numbers 5 representing the next characters "12/ . . . ", pertaining to the second-type sub-sequence 8a, and thus represented absolutely.

As illustrated in FIG. 3, it is possible, in order to secure the compressing method, to add a checksum 18, 19. Such a checksum 18 is computed from said original sequence 2. A copy 19 of said checksum 18 is then appended to the compressed sequence 3 before transmitting, e.g. at the end of said compressed sequence. This allows a receiver to check by comparing two redundant data: the compressed sequence 3 and said checksum 19. A positive result of said comparison is indicative of a correct compression and transmission, while a negative result indicates an error either in the compressing method/coding step or in the transmission.

A possible way to compute said checksum 18 is e.g. to sum up all the absolute numbers 5 of the characters 4 of the original sequence 2. While the number of characters in a string remains lesser than 256 said sum remains lesser than 65536 and can be written in two bytes. For a larger string, to keep a two bytes checksum, it is possible either to cut said string into 256 bytes sub-strings or to use a projecting checksum algorithm, e.g. neglecting any carry.

It is time now to describe the coding of displacement, using a relative coding table 20. A displacement 21 is defined between two following characters in said original sequence 2, and one can define a preceding character 22 and a following character 23. Since said characters pertain to a first type sub-sequence 7, they are both present in said relative coding table 20.

The principle is to consider a displacement 21, in said relative coding table 20 from said preceding character 22 to said following character 23. Considering said displacement 21, it can be decomposed into a horizontal displacement and a vertical displacement. It is thus possible to determine a first coordinate, and a second coordinate to define said displacement 21. The relative coding table 20 being a rectangular matrix, a first coordinate can be a circular count of the columns separating, said preceding character 22 from said following character 23, along a first predetermined direction, and a second coordinate can be a circular count of the rows separating, said preceding character 22 from said following character 23, along a second predetermined direction. The order rows/columns or columns/rows is arbitrary chosen, and may even be changed from one displacement 21 to the other, as long as it is agreed between compressing and decompressing methods.

For all displacements 21, the counting direction is advantageously the same. The columns can be counted from left to right or from right to left. The rows can be counted from top to bottom or from bottom to top. This may be constant or changed from one displacement 21 to the other, as long as it is agreed between compressing and decompressing methods. In the rest of the description a column counting direction from left to right and a row counting direction from top to bottom are assumed.

Said column, respectively row, counting is circular in that it is rounded so as to be comprised between 0 and the maximum number of columns minus 1, respectively the maximum number of rows minus 1.

Said determined first and second coordinates are then concatenates, in the order of the displacements, into movement numbers 15, into the compressed sequence 3.

With reference to FIG. 4, with the illustrative relative coding table 20, a displacement 21 between a preceding character 22 "F" and a following character "g" is detailed. "F" is in column 3, "g" is in column 5, the number of columns characterizing the displacement 21 from "F" to "g" along the direction left to right, is then 2. A first coordinate of said displacement 21 is then 2. "F" is in row 2, "g" is in row 5, the number of rows characterizing the displacement 21 from "F" to "g" along the direction top to bottom, is then 3. A second coordinate of said displacement 21 is then 3. The movement number 15 of said displacement 21 can thus be coded (2,3) or "23".

Considering now the displacement between character "g" and character "s", 24. Since the columns are counted from left-to-right, the number of columns separating "g" from "s" is 5. Here the circular counting implies that columns are considered circularly, columns 0 being again placed at the right of columns 7. Counting the rows, from top to bottom separating "g" from "s" leads to a count of 0 since they are both on the same row or to a count of 8, which is in turn rounded to 0, to remain comprised between 0 and 8−1=7, that is, modulo the maximum number of rows, here 8.

According to another inventive feature, said first coordinates are chosen in a first set of numbers and said second coordinates are chosen in a second set of numbers. No number is shared between said first set of numbers and said second set of numbers. Such a feature advantageously allows, when looking at a coordinate, to immediately know if it is a first coordinate or a second coordinate.

Consequently, since the relative ordering of respective first and second coordinates is known, such a feature allows omitting one first particular coordinate among said first set, and one second particular coordinate among said second set, in the compressed sequence 3. Due to the known relative ordering of first and second coordinates, such an omission can be easily detected during decoding, and corrected by having said omitted coordinate replaced by said corresponding first or second particular coordinate.

Said omission is the basis of the benefit that can be expected from the compressing method/coding step, in terms of reduced amount of bytes to be transmitted.

There is however an exception when applying said omission. When two such particular coordinates are immediately following, they cannot be both omitted, at the risk of losing at least one character during decoding. In such a case, the second particular coordinate of the two following ones is not omitted and instead is kept in the compressed sequence 3. Its presence allows the decompressing method/decoding step to retrieve back all originally presents characters.

In order to maximize the use of said relative coding table 20, that is, in order to extract most of or longest first type sub-sequences 7 from a given original sequence 2, said relative coding table 20 is advantageously populated with the most frequent characters, as expected in strings of text characters to be compressed.

For a given size N of a relative coding table 20, one place in said coding table 20 may be reserved to the EoC 16, all the others N−1 places are available and can be chosen to welcome the N−1 most frequent characters from the complete set of characters, as defined by the absolute coding table 10.

The relative frequencies of the characters are statistically estimated from the strings of text characters that are expected to be compressed. A frequency analysis can thus be applied for a given language used in said strings.

The illustrative relative coding table 20 of FIG. 4 is an 8×8 square matrix. It thus comprises 64 places. One place is reserved to EoC 16. The 63 remaining ones are populated from left to right and from top to bottom, by the 63 most frequent characters in english language.

It is advantageous to have a big relative coding table 20, comprising as much as characters from the complete set of characters as indicated by the absolute coding table 10 as possible, in order to maximize the use of said relative coding table 20, that is, in order to extract most of and longest first type sub-sequences 7 from a given original sequence 2.

According to an embodiment, said relative coding table 20 may comprise all characters from the complete set of characters as indicated by the absolute coding table 10. In the case of an absolute ASCII coding table 10, this leads to 256 characters, and thus to e.g. a 16×16 matrix relative coding table 20. The benefit gained from the extensive coding, due to the fact that any original sequence 2 is a first type sub-sequence 7 and can be coded, is decreased by the size needed to code the displacements, and the coordinates. For such a 16×16 relative coding table, each coordinate is chosen among 16 symbols, thus leading to an increased overhead of coding.

Accordingly it may be preferred to decrease the size of said relative coding table 20, and thus to decrease the size of the associated coordinates of displacements, and to focus the coding on first type sub-sequences 7 composed of most frequently used characters.

According to a preferred embodiment, said relative coding table is an 8×8 square matrix. This allows a coding of a first coordinate, respectively a second coordinate, by using 8 symbols.

In a particularly advantageous embodiment, the first coordinate is chosen in a first range of [0 . . . 7] according to the circular count of columns. So a coordinate of "0" indicates a displacement 21 between a preceding character 22 and a following character on the same column, a coordinate of "1" indicates a displacement 21 between a preceding character 22 and a following character on the immediately following column, and so on. Said column count is made e.g. from left-to-right.

In said embodiment the second coordinate is chosen in a second range of [8 . . . F] according to the circular count of rows, with 8 added. Said addition of 8 allows having no coordinate in common between first coordinates and second coordinates, while keeping a meaning for each coordinate. So a coordinate of "8" (meaning 0) indicates a displacement 21 between a preceding character 22 and a following character on the same column, a coordinate of "9" (meaning 1) indicates a displacement 21 between a preceding character 22 and a following character on the immediately following row, a coordinate of "A" (meaning 2) indicates a displacement 21 between a preceding character 22 and a following character of two rows, and so on. Said row count is made e.g. from top to bottom.

Due to the small size of said relative coding table 20, and the choice of the values for the coordinates, any coordinate may be expressed by an half byte, and a movement number 15 comprising a first coordinate and a second coordinate may be expressed by a byte.

In addition since the symbols used are different, a coordinate expressly indicates if it is a first coordinate or a second coordinate. A "D" coordinate indicates a count of 5 and also indicates it concerns rows/second coordinate. A "3" coordinate indicates a count of 3 and also indicates it concerns columns/first coordinate.

This allows omitting one first particular coordinate among the first coordinates: {0, 1, 2, 3, 4, 5, 6, 7} and one second particular coordinate among the set of second coordinates: {8, 9, A, B, C, D, E, F}.

Said omission, being the basis of the compression benefit, may be at least expected for one coordinate among the total number of coordinate, that is, here for ⅛, if assuming a normal distribution. A possible optimization of the placement of characters in said relative coding table 20 may even raise the compression benefit by having statistically more displacements using said omitted first particular coordinate and said second particular coordinate.

Said omitted first, respectively second, particular coordinate may be chosen arbitrarily, as long it is agreed between compressing method/coding step and decompressing method/decoding step. One possible choice among others is to omit the first coordinate corresponding to zero separating column and to omit the second coordinate corresponding to zero separating rows.

Consequently, in one embodiment, the first particular coordinate is "0" and the second particular coordinate is "8". This means a compression benefit may be expected when contiguous following characters in the original sequence 2 are located on either a same column or a same row of said relative coding table 20. The relative coding table 20 may be optimized, e.g. for a given language by placing statistically frequent following characters in strings on the same column or row of said relative coding table 20.

Reverting back to the example, the coding of displacements in the first type sub-sequence 7: "Orange voicemail: on", with reference to FIG. 2 is realized using the relative coding table 20 of FIG. 4 in the following way. The first character " " ("Space") 14 is absolutely represented by its absolute representing number: "20". Said first character 14 also define a first position in said relative coding table 20, on the first row, first column.

The immediately following character is "O". The first displacement is then from "Space" to "O". Since "O" is located in said relative coding table 20 on the first row, fourth column, the displacement can then be coded by a horizontal displacement of 4 columns and a vertical displacement of 0 row. This leads to a first coordinate or 4 and a second coordinate of 8 (0+8).

The following character is "r". The second displacement is then from "O" to "r". Since "r" is located in said relative coding table 20 on the sixth row, fifth column, the displacement can then be coded by a horizontal displacement of 1 column and a vertical displacement of 4 rows. This leads to a first coordinate or 1 and a second coordinate of C (4+8).

The following character is "a". The third displacement is then from "r" to "a". Since "a" is located in said relative coding table 20 on the fifth row, third column, the displacement can then be coded by a horizontal displacement of 5 columns and a vertical displacement of 0 row. This leads to a first coordinate of 5 and a second coordinate of 8.

The following character is "n". The fourth displacement is then from "a" to "n". Since "n" is located in said relative coding table 20 on the fifth row, seventh column, the displacement can then be coded by a horizontal displacement of 4 columns and a vertical displacement of 0 row. This leads to a first coordinate or 4 and a second coordinate of 8.

The following character is "g". The fifth displacement is then from "n" to "g". Since "g" is located in said relative coding table 20 on the sixth row, sixth column, the displacement can then be coded by an horizontal displacement of 7 and a vertical displacement of 1. This leads to a first coordinate of 7 and a second coordinate of 9 (1+8).

The following character is "e". The sixth displacement is then from "g" to "e". Since "e" is located in said relative coding table 20 on the fifth row, second column, the displacement can then be coded by a horizontal displacement of 4 columns and a vertical displacement of 7 rows. This leads to a first coordinate of 4 and a second coordinate of F (7+8).

The following character is "Space" leading to coordinates of 7 and C.

The following character is "v" leading to coordinates of 5 and E.

The following character is "o" leading to coordinates of 7 and E.

The following character is "i" leading to coordinates of 7 and 0.

The following character is "c" leading to coordinates of 4 and 9.

The following character is "e" leading to coordinates of 2 and F.

The following character is "m" leading to coordinates of 0 and A.

The following character is "a" leading to coordinates of 1 and E.

The following character is "i" leading to coordinates of 1 and 8.

The following character is "l" leading to coordinates of 6 and 9.

The following character is ":" leading to coordinates of 7 and 8.

The following character is "Space" leading to coordinates of 0 and B.

The following character is "o" leading to coordinates of 4 and C.

The following character is "n" leading to coordinates of 2 and 8.

The following character is "Space" leading to coordinates of 2 and C.

Said "Space" is the last character of sub-sequence 7. Accordingly a last displacement is coded toward the EoC 16, here located in the first column, fifth row. The last displacement is then from the last character "Space" to "EoC". The displacement can then be coded by a horizontal displacement of 0 column and a vertical displacement of 4 row. This leads to a first coordinate of 0 and a second coordinate of C.

The concatenation of all coordinates in the order according to the order of the characters in the original sub-sequence 7, following a possible relative order of first coordinate then second coordinate, leads to:

48 1C 58 48 79 4F 7C 5E 7E 78 49 2F 0A 1E 18 69 7[8 0]B 4C 28 2C 0C

Since 0 has been chosen as the first particular coordinate and 8 has been chosen as the second particular coordinate, they can be omitted from the coded subsequence, except when both of them are contiguous. There is one occurrence, noted by a box, where one can find a 0 immediately following an 8. In this case the following 0 in kept. This leads to:

4̶8̶ 1C 5̶8̶ 4̶8̶ 79 4F 7C 5E 7E 7̶8̶ 49 2F 0̶ A 1E 1 8̶ 69 7̶8̶ 0B 4C 2̶8̶ 2C 0̶ C which simplifies into:

41 C5 47 94 F7 C5 E7 E7 49 2F A1 E1 69 70 B4 C2 2C C 0

Said simplification is the main cause of compression benefit. Said sequence of numbers is then copied in order in the corresponding coded sub-sequence 11, as can be seen in FIG. 2.

It can be noted that the omission of particular coordinates, here 0 and 8, may lead, as in the example, to an uneven number of remaining coordinates. Since each coordinate occupies half a byte this may lead to an incomplete final byte. To comply with said restriction any incomplete final byte may be completed by a filler 17 of half a byte. Said filler 17, here italicized, may e.g. be filled of zeros, as in FIG. 2.

Depending on the content of a string, the compressing method/coding step may be advantageous in that the compressed sequence 3 is shorter than the original sequence 2.

As can be easily derived from the preceding description, a second type sub-sequence 8 does not provide any compression benefit, since it is identically copied from the original sequence 2 into the compressed sequence 3. For a first type sub-sequence 7, the compression benefit depends on the content of said sub-sequence 7. The compression benefits clearly results from the number of omitted particular coordinates compared to the added overhead. If two few omissions can be operated, a first type sub-sequence 7 may even be coded into a longer coded sub-sequence 11.

With reference to one embodiment, since said overhead includes the first specific control character 13 (1 byte) and the displacement toward EoC 16 (up to 1 byte), it may include up to two bytes. Each omission of a particular coordinate provides a gain of half a byte. The compression method then becomes beneficial if more than 4 omissions can be applied to a given first type sub-sequence 7. Inserting a checksum 18, 19 further adds two bytes. So if a first type sub-sequence 7 appears to provide less than 4 omissions, respectively 8 omissions (in the case of using a checksum), its coding may not be optimal. Such a string may advantageously better be treated as a second type sub-sequence.

According to an embodiment, the compression method may thus be optimized by adding the following steps. For each first type sub sequence 7 obtained from the parting step, if the coded sub-sequence 11 that would be obtained through the coding step has a length greater or equal than the length of the original sub-sequence 7, said first type sub-sequence 7 is treated as a second type sub-sequence, that is, it is not coded.

Reverting back to the example of FIG. 2, this is the case of the aforementioned sub-sequence "at", which is not considered as a first type sub-sequence, and thus not processed through the coding step, but instead is kept as part of a containing second type sub-sequence 8.

The compressing method and the coding step have been extensively described. The present disclosure also concerns the corresponding decompressing method.

Said decompressing method receives a compressed sequence 3, being an ordered sequence of numbers, and is in charge of decompressing it in order to provide back a final string of text characters in the form of a final ordered sequence identical to said original sequence 2.

Said decompressing method uses the same rectangular matrix relative coding table 20 as used by the compressing method. Said decompressing method comprises the following steps.

First, the decompressing method includes parsing said compressed sequence 3 into first type coded sub-sequences 11 coming from coding first type sub-sequences 7 and second type sub-sequences 12 coming from copying second type sub-sequences 8. This may be done by extracting from said compressed sequence 3 all present coded sub-sequences 11, if any are present.

The remaining numbers in said compressed sequence 3 after said extraction are kept. They can be gathered, when contiguous, into second type sub sequences 12. Each such second type sub-sequence 12 is copied as it is in a final second type sub-sequence, identical to the original second type sub-sequence 8.

Each first type coded sub-sequence 11 so extracted can be processed through a decoding step into a final first type decoded sub-sequence, identical to said original first type sub-sequence 7, using said relative coding table 20.

The extracting process may comprise several steps. Due to the coding scheme, a first type coded sub-sequence 11 can be detected, for the purpose of extraction, by its initial number, being the first specific control character 13. Any such first specific control character 13 found in a compressed sequence 3 is indicative of the presence of one first type coded sub sequence 11, starting after said first specific control character 13. Said first specific control character 13, once found is discarded and is not copied into the final decompressed sequence.

Then due to the relative coding by displacement, the first type coded sub-sequence 11 starting from said first specific control character 13 is decoded to find its end and thus to be able to finalize its extraction.

The initial number 14 immediately following said first specific control character 13 represents an absolute number 5, according to said absolute coding table 10, representing an initial character 14 also named keycode 14, first character of said final first type decoded sub-sequence. Said initial character 14 is thus copied into the final decompressed sequence as the first decoded character of said final first type decoded sub-sequence.

The remaining following numbers are considered as movement numbers 15, coding relative displacements. They can be decoded using said relative coding table 20.

Since the end of the first type coded sub-sequence 11 cannot typically be already known, the full compressed sequence 3 may be processed or pre-processed through the decoding step, until its end or until another first specific control character 13 is found in said compressed sequence 3.

Said decoding step may be ended when a displacement points toward a second specific control character EoC 16 in said relative coding table 20. This is indicative of an end of coding, and thus indicative of an end of said first type coded sub-sequence 11, that can, from this event, be extracted, having both its beginning and ending known.

The decoding step proceeds with reverse treatments corresponding to the ones applied during the coding step. The numbers following said keycode 14 are considered to be movement numbers 15 coding successive displacements, each displacement in relative coding table 20 defining a character 4 of the final decoded sub-sequence.

Each movement number 15 comprises a first coordinate and a second coordinate. The decoding step repeats, for each such movement number 15, the following steps.

The decoding step defines a current character, a current position being the position of said current character in said relative coding table 20 and a current movement number 15, comprising a first coordinate and a second coordinate. At start, the first current character is taken equal to said keycode 14 or initial character 14, the first current position is taken equal to the position of said keycode character 14 in said relative coding table 20, and the first movement number 15 is the first movement number found/extracted form the coded sub-sequence 11, that is the first number following said initial character 14.

The decoding step then applies, from the current position in said relative coding table 20, a displacement as coded by the current pair of first coordinate and second coordinate, where the first coordinate indicates a circular count of columns along a first predetermined direction, the second coordinate indicates a circular count of rows along a second predetermined direction, to find a new position indicating a new decoded character. Said new decoded character is copied to the final decompressed sequence after the last decoded character.

It can be noted here that the displacement is applied the same way as in the corresponding coding step, except that in the coding step a displacement 21 toward a character defines two coordinates, while in the decoding step two coordinates defines a displacement 21 which ends into a character. The first and second predetermined directions are the same as in the coding step.

The so found decoded character is then appended after the last decoded character in the first type final decoded sub-sequence.

If said new decoded is the EoC 16 character/position in said relative coding table 20, the decoding step ends. Said last displacement/EoC character is discarded in that it does appear in first type final decoded sub-sequence/final decompressed sequence.

While said newly decoded character is not the EoC 16, the current character is updated to said newly decoded character, the current position is updated to the corresponding new position of said newly decoded character and the current movement number 15 is updated to the next movement number 15 and the next pair of first coordinate and second coordinate, found in said coded sub-sequence 11. The process is then repeated with said newly current character, current position and current coordinates.

Such process then allows iteratively retrieving back all characters that have been coded into said coded sub-sequence 11.

In accordance with the coding scheme, if first coordinates are chosen in a first set of numbers and said second coordinates are chosen in a second set of numbers, with no number in common between said two sets, and if a particular first coordinate and/or an particular second coordinate has been omitted, a preprocessing step may be performed to transform the sequence of numbers found in a first type coded sub-sequence 11 after the keycode 16 into a sequence of movement numbers 15. The aim of said preprocessing is to reintroduce back said omitted particular first and/or second coordinates.

Said preprocessing step may be decomposed into the following steps. First the sequence of numbers of said coded sub-sequence 11 following said keycode 16 are separated in coordinates. Since first and second coordinates are not chosen in the same set of numbers, a number representing a coordinate immediately indicates if it is a first coordinate or a second coordinate.

A particular coordinate has normally been omitted during the coding step, except when two particular coordinates where following. So any particular coordinate found in said coded sub-sequence 11 is indicative of such a pair configuration. To restore back the complete coded sub-sequence 7 without omission, whenever a first particular coordinate is found in the coded sub-sequence 11, a second particular coordinate is inserted before said first particular coordinate. Similarly whenever a second particular coordinate is found in the coded sub-sequence 11, a first particular coordinate is inserted before said second particular coordinate.

These two steps of restoring multiples following particular coordinates are advantageously applied before the two next steps.

Since the first and/or second coordinate where placed according to a given order before omissions where applied during the coding step, it is possible to determine where any coordinate is missing due to its omission.

For example, if a typical order, alternating a first coordinate and a second coordinate has been followed when coding, two contiguously following first coordinates in said coded sub-sequence 11 indicate that a second coordinate is missing in between the two of them. Said missing second coordinate can then be determined to be a particular second coordinate that can be reinserted in between.

So whenever two contiguous second coordinates are found, as indicated by their numbers, a first particular coordinate is inserted between them. Similarly whenever two contiguous first coordinates are found, as indicated by their numbers, a second particular coordinate is inserted between them.

In any case, the relative coding table 20, the choice of the sets of numbers for the first and for the second coordinates, the first and second counting directions, the first and second particular coordinates, are shared between the compressing method/coding step and the decompressing method/decoding step.

According to the embodiment, the relative coding table 20 is an 8×8 square matrix, the same as used by the coding step, said first coordinate being chosen in a first range of [0 . . . 7] according to the circular count of columns from left to right, said second coordinate being chosen in a second range of [8 . . . F] according to the circular count of rows, with 8 added, from top to bottom, the first particular coordinate being 0 and the second particular coordinate being 8.

Reverting back to the example compressed sequence of FIG. 2, is illustrated a decompressing. The fifth first numbers of the compressed sequence 3: {22, 38, 38, 38, 22} do not comprise any first control character 13, since no "12" (DC2) is present. Accordingly this is a second type sub-sequence 12 already coded in ASCII according to the absolute coding table 10.

The sixth number is a "12" (DC2) and thus indicates the beginning of a first type coded sub-sequence 11. The next number is "20". Since it is a keycode 14 it is absolutely interpreted using the absolute coding table 10 as a " " (or "Space") character.

The following sequence containing numbers coding successive displacements is: {41, C5, 47, 94, F7, C5, E7, E7, 49, 2F, A1, E1, 69, 70, B4, C2, 2C, C0, 31, 32, 2F, 30, . . . }.

First the decoding step separates them in coordinates, here in half bytes, leading to: {4, 1, C, 5, 4, 7, 9, 4, F, 7, C, 5, E, 7, E, 7, 4, 9, 2, F, A, 1, E, 1, 6, 9, 7, 0, B, 4, C, 2, 2, C, C, 0, 3, 1, 3, 2, 2, F, 3, 0, . . . }

Then the decoding step searches for particular first coordinates, that is "0", or particular second coordinates, that is "8". Three "0" are present and an "8" is inserted before each of them. No "8" is present. This leads to: {4, 1, C, 5, 4, 7, 9, 4, F, 7, C, 5, E, 7, E, 7, 4, 9, 2, F, A, 1, E, 1, 6, 9, 7, 8, 0, B, 4, C, 2, 2, C, C, 8, 0, 3, 1, 3, 2, 2, F, 3, 8, 0, . . . }.

Then the decoding step tests if any successive coordinate are of the same type. This is the case e.g. with the two first coordinate. "4" is a first coordinate and "1" is also a first coordinate. This indicates a particular second coordinate "8" missing between them. Similarly the fourth coordinate "5" and the sixth coordinate "4" are both first coordinate. An "8" is inserted between them. Similarly an "A" following an "F" can be found. Since they are both second coordinates, a missing "0" is inserted between them. Considering all the occurrences, this leads to: {48, 1C, 58, 48, 79, 4F, 7C, 5E, 7E, 78, 49, 2F, 0A, 1E, 18, 69, 78, 0B, 4C, 28, 2C, 0C, 08, 08, 38, 18, 38, 28, 2F, 38, 0, . . . }, figuring a regular alternation of first and second coordinates. Each byte/number can then be interpreted as a movement number 15 comprising a first coordinate and a second coordinate.

Since the keycode 14 is a "Space" character, the first position in said relative coding table 20 is on first column, first row. From this position, the displacement defined by the first movement number 15 being "48" is applied. Said displacement is defined by 4 columns from left to right and 8 or 0 rows from top to bottom, thus indicating character "0".

Starting from the second position of said second character "0", the second movement number 15 is "1C" defining a displacement of 1 column from left to right and C or 4 rows from top to bottom, thus indicating character "r".

The same process is applied iteratively, and provides the others characters in order: "range voicemail: on". The last "Space" character is followed by a movement number 15 equal to "0C". Said displacement on the same (0) column and of C or 4 rows points to the location of EoC 16, and thus indicates the end of the first type sub-sequence and that said "Space" character was the last character.

From the remaining numbers, following said "0C" number and initially mistaken for numbers coding successive displacements: {08, 08, 38, 18, 38, 28, 2F, 38, 0, . . . } the first "0" can be identified as a filler 17 and be ignored. The others numbers, or instead their corresponding numbers, in initial form, before the reintroduction of "0" and "8": {31, 32, 2F, 30, . . . } can from now on be considered as pertaining to a second type sub-sequence 12. They can be decompressed/copied as: "12/0 . . . ", until a new first control character 13 is found, indicative of the beginning of a new first type coded sub-sequence 11a and thus also of the end of said second type sub-sequence 12.

Figure 5:
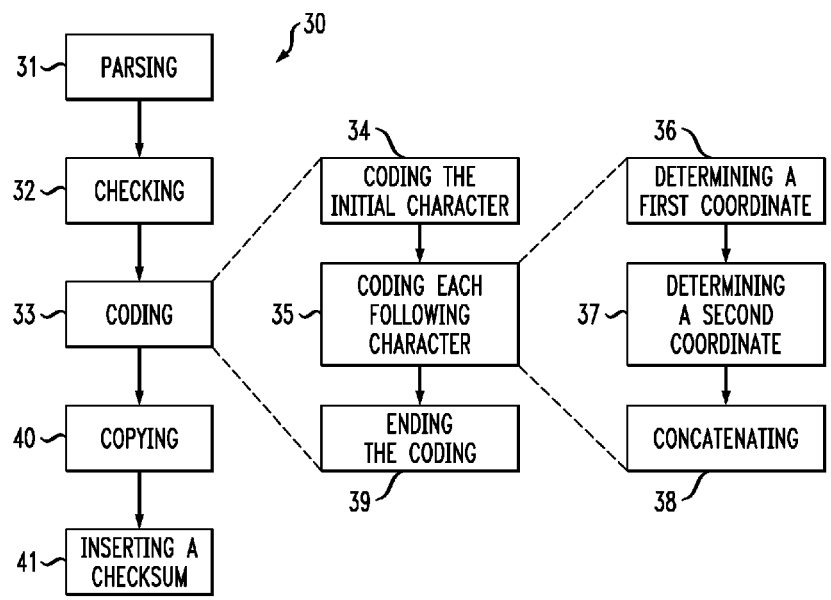
FIG. 5 illustrates a flowchart of a compression method according to one embodiment.

FIG. 5 shows a possible embodiment of a compression method 30. Said compression method 30 starts with a parsing step 31. Next comes a coding step 33, followed by a copying step 40. The compression method 30 may end with an optional inserting a checksum step 41.

An optional checking step 32 may be inserted between the parsing step 31 and the coding step 33.

The coding step 33 is further parted into a step of coding 34 the initial character, a step of coding 35 each following character and a step of ending the coding 39.

The step of coding 35 each following character is further parted into a determining 36 a first coordinate step, a determining 37 a second coordinate step and a concatenate 38 step.

The disclosure also concerns a compressor device 50 comprising means for compressing a string of text characters into a compressed sequence 3 according to any one of the above described embodiments of the compressing method.

Figure 6:
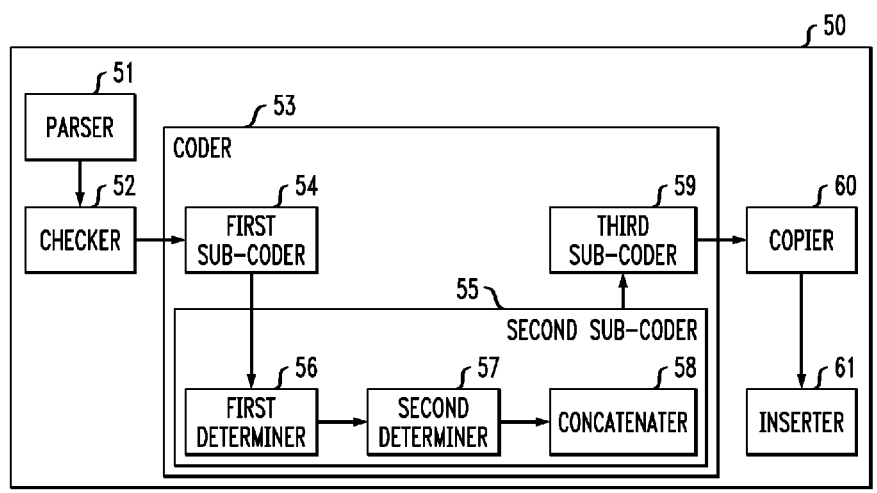
FIG. 6 illustrates a compressor according to one embodiment.

As illustrated in FIG. 6, such a compressor device 50 comprises a parser 51, an optional checker 52, a coder 53, a copier 60 and an optional inserter 61. Said coder 53 further comprises a first sub-coder 54, a second sub-coder 55 and a third sub-coder 59. Said second sub-coder 55 further comprises a first determiner 56, a second determiner 57 and a concatener 58.

Figure 7:
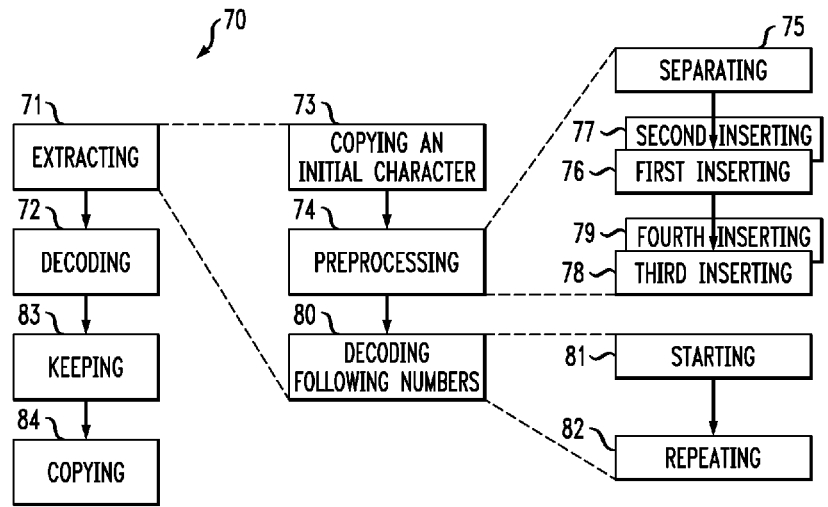
FIG. 7 illustrates a flowchart of a decompression method according to one embodiment.

FIG. 7 shows a possible embodiment of a decompression method 70. Said decompression method 70 starts with an extracting step 71. Next comes a decoding step 72, followed by a keeping step 83. The compression method 70 may end with a copying step 84.

The extracting step 71 and the decoding step 72 may further be parted into a copying 73 an initial character step, a preprocessing step 74 and a decoding 80 following numbers step.

The preprocessing step 74 is further parted into a separating step 75, a first inserting step 76, a second inserting step 77, a third inserting step 78 and a fourth inserting step 79.

The decoding step 80 is further parted into a starting step 81 and a repeating step 82.

The disclosure also concerns a decompressor device (90) comprising means for decompressing a compressed sequence (3) into a string of characters according to any one of the above described embodiments of the decompressing method.

Figure 8:
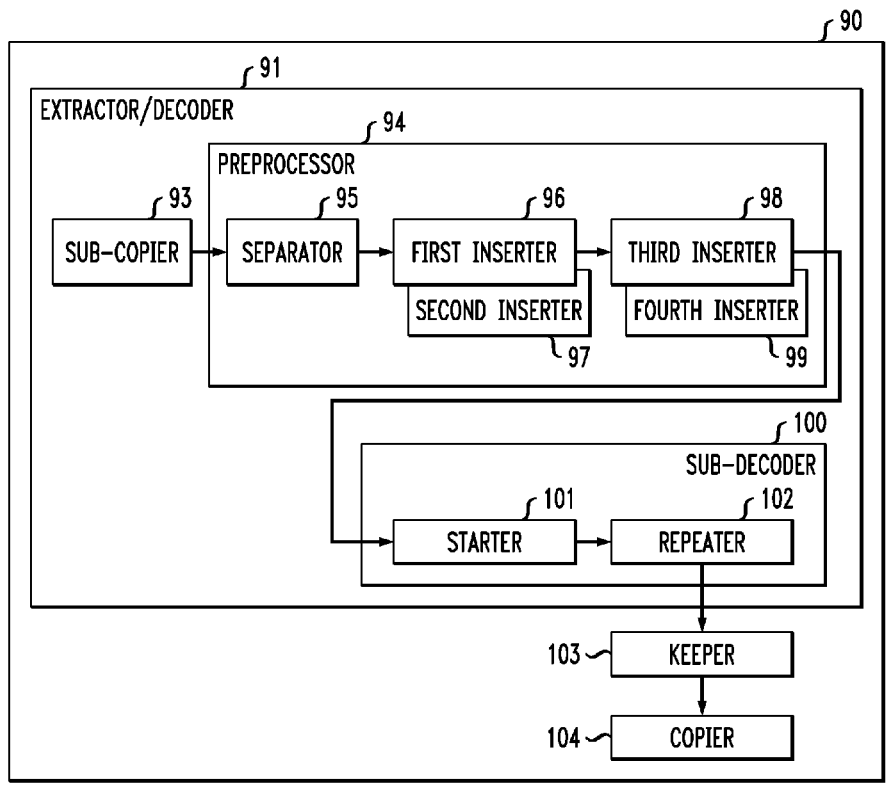
FIG. 8 illustrates a decompressor according to one embodiment.

As illustrated in FIG. 8, such a decompressor device 90 comprises an extractor/decoder 91, a keeper 103 and a copier 104. Said extractor/decoder 91 further comprises a sub-copier 93, a preprocessor 94 and a sub-decoder 100. Said sub-decoder 100 further comprises a starter 101 and a repeater 102. Said preprocessor 94 further comprises a separator 95, a first insertor 96, a second insertor 97, a third insertor 98 and a fourth insertor 99.

The previously described compression and decompression methods can be used according to three embodiments, providing decreasing compression ratios/benefits.

According to a first embodiment, named X, a first type sub-sequence 7 is coded using a relative coding table 20 and no checksum is added. Said embodiment provides the highest compression ratio but is less secure.

According to a second embodiment, named Y, a first type sub-sequence 7 is coded using a relative coding table 20 and a checksum 18 is added. Said embodiment provides a lesser compression ratio but is more secure, since said checksum 18 may allow detecting an error.

According to a third embodiment, named Z, a first type sub-sequence 7 is not coded. Otherwise written, no first type sub-sequence is extracted from an original sequence 2, or any original sequence 2 is considered as a single second type sub-sequence. Said embodiment provides the least compression ratio, but is the most secure.

According to a global strategy, encompassing both the compressing method/device and the decompressing method/device, said three embodiments may advantageously be combined.

The embodiment among X, Y and Z, is agreed between the compressing method and the decompressing method, e.g. by a code added to the transmitted compressed sequence 3. Compressor and decompressor jointly select one of the three modes X, Y or Z, according to errors any one of them has detected.

Depending of said numbers of errors, e.g. compared to thresholds, the global strategy may opt to change the current embodiment. If too many errors are present the global strategy may try to reduce the number of errors by selecting a new embodiment providing an increased security at the price of a lesser compression ratio. Instead if too few errors are present the global strategy may try to increase the compression ratio by selecting a new embodiment providing an increased compression ratio.

The invention claimed is:

1. A method for compressing a string of characters, initially defined by an original ordered sequence of characters represented by at least one absolute number uniquely representing at least one character, according to an absolute coding table, comprising:

parsing said original sequence into at least one first type sub-sequence comprising contiguous characters, at least one of the contiguous characters of the first type sub-sequence matching a corresponding character in a relative coding table, and into at least one second type sub-sequence comprising contiguous remaining characters, coding the at least one first type sub-sequence using said relative coding table, copying the characters from the at least one second type sub-sequence in said compressed sequence, at least one character being represented by its absolute representing number from said absolute coding table, wherein the coding of a first type sub-sequence comprises:

coding the initial character of said sub-sequence by its original absolute representing number from said absolute coding table, as a keycode, coding the characters following said initial character in said sub-sequence by coding a displacement in said relative coding table, between a character preceding said character and said character, ending the coding of said first type sub-sequence by coding a displacement toward a second specific control character in said relative coding table, indicative of an end of coding, after the last character in said sub-sequence, wherein the coding of a displacement in said relative coding table, between a preceding character and a following character, comprises:

determining a first coordinate, separating, in said relative coding table, said preceding character from said following character, along a first predetermined direction, determining a second coordinate, separating, in said relative coding table, said preceding character from said following character, along a second predetermined direction, concatenating determined coordinates, in order, into the compressed sequence, wherein said first coordinates are chosen in a first set of numbers and said second coordinates are chosen in a second set of numbers, wherein no number is shared between said first set of numbers and said second set of numbers, and wherein one first particular coordinate among said first set, and one second particular coordinate among said second set, are omitted in the compressed sequence, except when two particular coordinates are immediately following, in which case said following particular coordinate is not omitted.

2. The method of claim 1, further comprising:
inserting a checksum, computed from said original sequence, into said compressed sequence.

3. The method of claim 1, wherein said relative coding table is populated with the most frequent characters, as expected in strings of characters to be compressed.

4. The method of claim 1, wherein said relative coding table is an 8 by 8 matrix, said first coordinate being chosen in a first range of [0 . . . 7] according to a circular count of columns from left to right, said second coordinate being chosen in a second range of [8. . . F] according to a circular count of rows, with 8 added, from top to bottom, the first particular coordinate being the first coordinate corresponding to zero separating columns, and the second particular coordinate being the second coordinate corresponding to zero separating rows.

5. The method of claim 1, further comprising, between the parsing and the coding:
checking for the at least one first type sub-sequence if the coded subsequence that would be obtained through a coding is shorter than the original sub-sequence,
if not, treating said first type sub-sequence as a second type sub-sequence.

6. A method for decompressing a compressed sequence, into a string of characters, defined by a final ordered sequence of characters represented by at least one absolute number uniquely representing at least one character, according to an absolute coding table, comprising:
extracting from said compressed sequence at least one coded sub-sequence of contiguous numbers,
decoding said coded sub-sequence into a final decoded sub-sequence, using a relative coding table,
keeping remaining numbers and
copying said remaining numbers into the decompressed sequence as at least one character represented by an absolute number using said absolute coding table
wherein extracting and decoding further comprise:
copying an initial number as a character represented by said absolute number according to said absolute coding table, in said final decoded sub-sequence,
preprocessing following numbers, following said initial number, in said coded sub-sequence,
decoding following numbers, as relative displacements, in said relative coding table, until a displacement points toward a second specific control character in said relative coding table, indicative of an end of coding, and thus indicative of an end of said coded sub-sequence,
wherein decoding following numbers further comprises:
starting with a current character being said initial character, a current position being the position of said initial character in said relative coding table, and a current pair of coordinates being the first pair of first coordinate and second coordinate in said coded sub-sequence,
repeating the following, until the new position points toward a second specific control character in said relative coding table:
applying from the current position in said relative coding table, a displacement as coded by the current pair of first coordinate and second coordinate, the first coordinate indicating a circular count of columns along a first predetermined direction, the second coordinate indicating a circular count of rows along a second predetermined direction, to find a new position, indicating a new decoded character,
copying said new decoded character after said current character in said decoded final sub-sequence,
updating the current character to said new decoded character, updating the current position to said new position, updating the current pair of coordinate to the next pair of first coordinate and second coordinate in said coded sub-sequence,
wherein said first coordinates are chosen in a first set of numbers and said second coordinates are chosen in a second set of numbers, wherein no number is shared between said first set of numbers and said second sets of numbers, wherein the preprocessing following numbers further comprises:
separating said following numbers into coordinates,
inserting a first particular coordinate before any second particular coordinate,
inserting a second particular coordinate before any first particular coordinate,
inserting a first particular coordinate between any two contiguous second coordinates,
inserting a second particular coordinate between any two contiguous first coordinates.

7. The method of claim 6, wherein said relative coding table is an 8 by 8 matrix, said first coordinate being chosen in a first range of [0 . . . 7] according to the circular count of columns from left to right, said second coordinate being chosen in a second range of [8. . . F] according to the circular count of rows, with 8 added, from top to bottom, the first particular coordinate being the first coordinate corresponding to zero separating columns, and the second particular coordinate being the second coordinate corresponding to zero separating rows.

8. A compressor for compressing a string of characters initially defined by an original ordered sequence of characters represented by at least one absolute number uniquely representing at least one character, according to an absolute coding table, into a compressed sequence, comprising:
at least one processor configured as:
a parser that parses said original sequence into at least one first type sub-sequence comprising contiguous characters, the contiguous characters of the first type sub-sequence being selected based on a corresponding character in a relative coding table, and into at least one second type sub-sequence comprising contiguous remaining characters,
a coder that codes the at east one first type sub-sequence using said relative coding table,
a copier that copies characters from the at least one second type sub-sequence in said compressed sequence, at least one character being represented by its absolute representing number from said absolute coding table,
wherein the coder further comprises:
a first sub-coder that codes the initial character of said subsequence by its original absolute representing number from said absolute coding table, as a keycode,
a second sub-coder that codes characters following said initial character in said sub-sequence by coding a displacement in said relative coding table, between a character preceding said character and said character,
a third sub-coder that ends the coding of said first type subsequence by coding a displacement toward a second specific control character in said relative coding table, indicative of an end of coding, after the last character in said sub-sequence,
wherein the second sub-coder further comprises:
a first determiner that determines a first coordinate, separating, in said relative coding table, said preceding character from said following character, along a first predetermined direction, a second determiner that determines a second coordinate, separating, in said relative coding table, said preceding character from said following character, along a second predetermined direction, and a concatener that concatenates all determined coordinates, in order, into the compressed sequence, wherein said first coordinates are chosen in a first set of numbers and said second coordinates are chosen in a second set of numbers, wherein no number is shared between said first set of numbers and said second set of numbers, and wherein one first particular coordinate among said first set, and one second particular coordinate among said second set, are omitted in the compressed sequence, except when two particular coordinates are immediately following, in which case said following particular coordinate is not omitted.

9. The compressor of claim 8, the at least one processor configured as:
an inserter that inserts a checksum computed from said original sequence, into said compressed sequence.

10. The compressor of claim 8, wherein said relative coding table is populated with the most frequent characters, as expected in strings of characters to be compressed.

11. The compressor of claim 8, wherein said relative coding table is an 8 by 8 matrix, said first coordinate being chosen in a first range of [0 . . . 7] according to a circular count of columns from left to right, said second coordinate being chosen in a second range of [8. . . F] according to a circular count of rows, with 8 added, from top to bottom, the first particular coordinate being the first coordinate corresponding to zero separating columns, and the second particular coordinate being the second coordinate corresponding to zero separating rows.

12. The compressor of claim 8, the at least one processor configured as a checker that checks for the at least one first type sub-sequence if the coded sub-sequence that would be obtained is shorter than the original sub-sequence, and if not, treats said first type subsequence as a second type sub-sequence.

13. A decompressor for decompressing a compressed sequence into a string of characters defined by a final ordered sequence of characters represented by at least one absolute number uniquely representing at least one character, according to an absolute coding table, comprising:
at least one processor configured as:
an extractor that extracts from said compressed sequence at least one coded sub-sequence of contiguous numbers,
a decoder that decodes said coded sub-sequence into a final decoded sub-sequence, using a relative coding table,
a keeper that keeps remaining numbers, and
a copier that copies said remaining numbers into the decompressed sequence as at least one character represented by an absolute number using said absolute coding table
wherein the extractor and decoder further comprise:
a sub-copier that copies an initial number as a character represented by said absolute number according to said absolute coding table, in said final decoded sub-sequence, a preprocessor that preprocesses following numbers, following said initial number, in said coded sub-sequence, a sub-decoder that decodes following numbers, as relative displacements, in said relative coding table, until a displacement points toward a second specific control character in said relative coding table, indicative of an end of coding, and thus indicative of an end of said coded sub-sequence, wherein the sub-decoder further comprises:
a starter that starts with a current character being said initial character, a current position being the position of said initial character in said relative coding table, and a current pair of coordinates being the first pair of first coordinate and second coordinate in said coded sub-sequence,
a repeater that repeats, until the new position points toward a second specific control character in said relative coding table:
applying from the current position in said relative coding table, a displacement as coded by the current pair of first coordinate and second coordinate, the first coordinate indicating a circular count of columns along a first predetermined direction, the second coordinate indicating a circular count of rows along a second predetermined direction, to find a new position, indicating a new decoded character,
copying said new decoded character after said current character in said decoded final sub-sequence,
updating the current character to said new decoded character, updating the current position to said new position, updating the current pair of coordinate to the next pair of first coordinate and second coordinate in said coded sub-sequence, wherein said first coordinates are chosen in a first set of numbers and said second coordinates are chosen in a second set of numbers, wherein no number is shared between said first set of numbers and said second sets of numbers, and wherein the preprocessor further comprises:
a separator that separates said following numbers into coordinates,
a first insertor that inserts a first particular coordinate before any second particular coordinate,
a second insertor that inserts a second particular coordinate before any first particular coordinate,
a third insertor that inserts a first particular coordinate between any two contiguous second coordinates,
a fourth insertor that inserts a second particular coordinate between any two contiguous first coordinates.

14. The decompressor of claim 13, wherein said relative coding table is an 8 by 8 matrix, said first coordinate being chosen in a first range of [0 . . . 7] according to the circular count of columns from left to right, said second coordinate being chosen in a second range of [8. . . F] according to the circular count of rows, with 8 added, from top to bottom, the first particular coordinate being the first coordinate corresponding to zero separating columns, and the second particular coordinate being the second coordinate corresponding to zero separating rows.

\* \* \* \* \*